（12） United States Patent
Lee

(10) Patent No.: US 6,392,958 B1
(45) Date of Patent: May 21, 2002

(54) ASYNCHRONOUS SRAM COMPATIBLE MEMORY DEVICE USING DRAM CELL AND METHOD FOR DRIVING THE SAME

(75) Inventor: Sun Hyoung Lee, Seoul (KR)

(73) Assignee: Silicon7 Inc., Kyungkido (KR)

( * ) Notice: Subject to any disclaimer, the term of this patent is extended or adjusted under 35 U.S.C. 154(b) by 0 days.

(21) Appl. No.: 09/822,487

(22) Filed: Apr. 2, 2001

(30) Foreign Application Priority Data

Dec. 4, 2000 (KR) .................................. 2000-0072815

(51) Int. Cl.[7] .............................................. G11C 8/18
(52) U.S. Cl. ...................... 365/233.5; 365/233; 365/222
(58) Field of Search ................................ 365/154, 156, 365/149, 222, 233, 233.5

(56) References Cited

U.S. PATENT DOCUMENTS 5,999,474 A * 12/1999 Leung et al. ................ 365/222

* cited by examiner

*Primary Examiner*—Andrew Q. Tran
(74) *Attorney, Agent, or Firm*—Rabin & Berdo

(57) ABSTRACT

An easily implemented SRAM compatible memory device usable as a low power asynchronous SPRAM and a driving method therefor. The method for driving the SRAM compatible memory device includes the steps of (a) inputting a leading address designating at least one of the plurality of memory cells, (b) generating an address transition detection signal in response to the input leading address, (c) allowing a predetermined DRAM access time to elapse after generation of the address transition detection signal, (d) performing an access operation of the DRAM memory array for the duration of the DRAM access time after step (c), and (e) inputting a lagging address different from the leading address after the lapse of a predetermined SRAM access time from the leading address input time. The SRAM access time is equal to or longer than twice the DRAM access time. In the SRAM compatible memory device and the driving method therefor, a DRAM memory cell is operated twice within an access time of an SRAM access time, thereby being fully compatible with an asynchronous SRAM.

33 Claims, 14 Drawing Sheets

* Generate WRITE command from an IDLE state
* Activate WEB within D_tRC and input data

ASYNCHRONOUS SRAM COMPATIBLE MEMORY DEVICE USING DRAM CELL AND METHOD FOR DRIVING THE SAME

BACKGROUND OF THE INVENTION

1. Field of the Invention

The invention relates to a semiconductor memory device, and more particularly, to an asynchronous static random access memory (SRAM) using a dynamic random access memory (DRAM) cell, and a method for driving the same.

2. Description of the Related Art

In general, a random access memory (RAM) of a semiconductor memory device is classified as either an SRAM or a DRAM. A unit memory cell for storing one-bit of information used in a conventional SRAM is implemented by four (4) transistors cross-coupled as a latch and two (2) transistors serving as a transfer gate.

In a general SRAM, since stored data is latched, a refresh operation for data retention is not required. Also, SRAMs typically are able to operate faster and consume less power than DRAMs.

However, since an SRAM unit memory cell is implemented by six (6) transistors, it occupies a larger die area than a DRAM unit memory cell implemented by one transistor and one capacitor. Therefore, the die area of an SRAM required for implementing a memory device with the same memory capacity is approximately 6 to 10 times that of a DRAM. So, the manufacturing cost is increased.

In order to reduce the cost, a conventional DRAM may be used instead of an SRAM. In this case, however, a DRAM controller is additionally required for periodic refresh operations. Also, the overall performance of the system itself may be deteriorated due to the periodic refresh operation and low-speed operation of the DRAM.

To overcome the disadvantages of the DRAM and SRAM, various implementations of the SRAM using DRAM cells continuously are being devised. One such implementation is disclosed in U.S. Pat. No. 5,999,474 to Wingyu Leung et al., in which a memory device consists of a multi-bank DRAM and an SRAM cache, so that the refresh of the memory can be hidden from the outside to be compatible with an SRAM.

However, according to the technology of the above-noted U.S. patent, an SRAM having the same storage capacity and configuration as a single DRAM bank, needs to be provided inside a memory device, and the circuit implementation is relatively complicated. Also, the memory device according to the above-noted U.S. patent is compatible with a synchronous SRAM in which external clocks are necessary. Thus, the technology based on the above-noted U.S. patent cannot be applied to a low power asynchronous SRAM for mobile equipment or the like.

SUMMARY OF THE INVENTION

To solve the above problems, it is an object of the invention to provide an asynchronous SRAM compatible memory device using a DRAM cell, which is easily implemented and can be used as a low power asynchronous SRAM.

Another object of the invention is to provide a method for driving the asynchronous SRAM compatible memory device.

Accordingly, to achieve the above object, there is provided an SRAM compatible memory device in which a leading address is primarily input and then a lagging address is secondarily input after a predetermined SRAM access time, the SRAM access time being elapsed for accessing valid data from the outside. The SRAM compatible memory device includes a DRAM memory array and a DRAM operation controller. The DRAM memory array has a plurality of DRAM memory cells arranged in rows and columns. Each DRAM memory cell requires a refresh operation for retention of data stored within a predetermined refresh period. The DRAM operation controller controls the DRAM memory array to perform an access operation after a predetermined DRAM access time (period) has elapsed from a time at which the leading address is primarily input. The SRAM access time (period) is equal to or longer than twice the DRAM access time.

According to another aspect of the invention, there is provided a SRAM compatible memory device including an array of DRAM memory cells arranged in rows and columns. Each DRAM memory cell requires a refresh operation for retention of data stored within a predetermined refresh period. A leading address is primarily input, and then a lagging address is secondarily input after a predetermined SRAM access time (period) has elapsed for accessing valid data from the outside. The SRAM access time is equal to or longer than the sum of a refresh time for refreshing the DRAM memory cells and a DRAM access time for effectively accessing the DRAM memory cells.

According to still another aspect of the invention, there is provided an SRAM compatible memory device. In the SRAM compatible memory device, a leading address is primarily input, and then a lagging address is secondarily input after a predetermined SRAM access time has elapsed for accessing valid data from the outside. The SRAM compatible memory device comprises a DRAM memory array and a DRAM operation controller. The DRAM memory array has a plurality of DRAM memory cells arranged in rows and columns. Each DRAM memory cell requires a refresh operation for retention of data stored within a predetermined refresh period. The DRAM operation controller controls the DRAM memory array to start an actual access operation during a predetermined DRAM access time (period), in response to the input of a leading address. The DRAM operation controller controls the DRAM memory array to input the lagging address after another DRAM access time from a time at which the actual operation is completed. The SRAM access time is equal to or longer than twice the DRAM access time.

To achieve another object of the invention, there is provided a method for driving an SRAM compatible memory device. The SRAM compatible memory device has a DRAM memory array including a plurality of DRAM memory cells arranged in a row and column type matrix. Each DRAM memory cell requires a refresh operation for retention of data stored within a predetermined refresh period. The method includes the steps of (a) inputting a leading address designating at least one of the plurality of memory cells, (b) generating an address transition detection signal in response to the input leading address, (c) allowing a predetermined DRAM access time to elapse after generation of the address transition detection signal, (d) after the step (c), performing an access operation to access the DRAM memory array for the duration of the DRAM access time, and (e) inputting a lagging address different from the leading address after the lapse of a predetermined SRAM access time measured from time of inputting the leading address. The SRAM access time is equal to or longer than twice the DRAM access time.

According to another aspect of the invention, there is provided a method for driving an SRAM compatible memory device. The SRAM compatible memory device includes an array of DRAM memory cells arranged in rows and columns, each DRAM memory cell requiring a refresh operation for retention of data stored within a predetermined refresh period. The method comprises the steps of (a) inputting a leading address designating at least one of the plurality of memory cells, (b) generating an address transition detection signal in response to the input leading address, (c) performing an access operation to access the DRAM memory array for the duration of a predetermined DRAM access time in response to the address transition detection signal, (d) allowing another DRAM access time to elapse after the step (c), and (e) inputting a lagging address different from the leading address after the lapse of a predetermined SRAM access time measured from the leading address input time. The SRAM access time is equal to or longer than twice the DRAM access time.

In the SRAM compatible memory device and method of driving the same according to the invention, the DRAM memory cell is operated twice within each access time, to be fully compatible with an asynchronous SRAM. Also, the SRAM compatible memory according to the invention can be easily implemented. Further, since the SRAM compatible memory according to the invention uses DRAM cells, it can function as a low power asynchronous SRAM.

BRIEF DESCRIPTION OF THE DRAWINGS

The foregoing and further objects, features and advantages of the invention will become more apparent from a consideration of the following description, the appended claims and the accompanying drawings in which the same numerals indicate the same or corresponding parts.

DESCRIPTION OF THE PREFERRED EMBODIMENT

Figure 1:
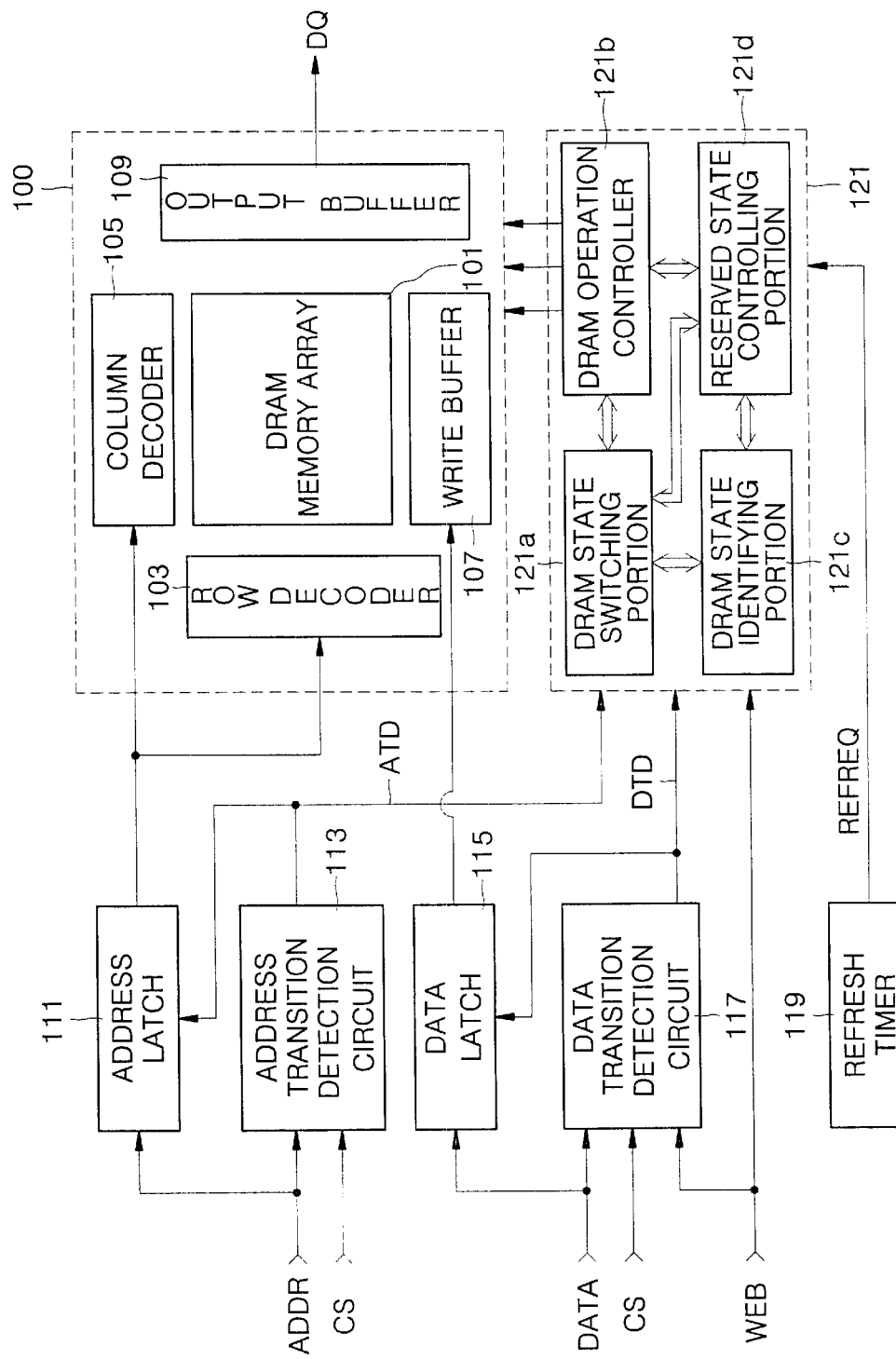
FIG. 1 is a block diagram of an SRAM compatible memory device according to an embodiment of the invention.

FIG. 1 is a block diagram of an SRAM compatible memory device according to an embodiment of the invention. The SRAM compatible memory device according to the invention is implemented using a DRAM memory cell. A plurality of DRAM memory cells is arranged in a DRAM memory array shown in FIG. 1. The DRAM memory cell is implemented by including one transistor and one capacitor as a unit cell. Thus, in order to retain data stored therein, a refresh operation is performed within a predetermined refresh period.

An externally input address ADDR is decoded by a row decoder 103 and a column decoder 105. Also, a specific memory cell arranged at a row and column of the DRAM memory cell array 101, is designated with the decoded address. Externally input data is stored in the designated memory cell in a write (WRITE) mode. Also, in a read (READ) mode, the data stored in the designated memory cell is output to the outside through an output buffer 109. In this specification, for the convenience of explanation, the DRAM memory array 101, the row decoder 103, the column decoder 105, a write buffer 107 and the output buffer 109, are referred to as an internal DRAM 100.

In order to effectively perform the read/write operations of the internal DRAM 100, an address latch 111, an address transition detection (ATD) circuit 113, a data latch 115 and a data transition detection (DTD) circuit 117 are incorporated in the SRAM compatible memory device. The address latch 111 latches the ADDR and supplies the same to the row decoder 103 and the column decoder 105. The ATD circuit 113 detects the change in the logic level of the ADDR to generate an address transition detection (ATD) signal. The ATD signal becomes activated with a predetermined pulse width when the ADDR makes a transition in a state in which a chip selection signal CS is logic "high".

The data latch 115 latches input data DATA and supplies the same to the write buffer 107. The DTD circuit 117 generates a data transition detection (DTD) signal. The DTD signal becomes activated with a predetermined pulse width when the DATA is input and a write enable (WEB) signal goes "low".

Also, a refresh timer 119 for refreshing DRAM memory cells arranged in the memory array 101, is incorporated in the SRAM compatible memory device according to an embodiment of the invention. A refresh request (REFREQ) signal supplied from the refresh timer 119 is activated for a constant refresh period.

Although the SRAM compatible memory device according to the invention internally employs DRAM memory cells, an externally controlled refresh operation is not required, which makes the SRAM compatible memory device similar to the conventional SRAM. Also, signals for controlling the refresh operation are not input. In other words, the SRAM compatible memory device of the invention operates externally in the same manner that the conventional SRAM does.

For implementation of the operation shown in FIGS. 2 through 11, a DRAM operation controller 121 is incorporated in the SRAM compatible memory device according to an embodiment of the invention. In detail, the DRAM operation controller 121 includes a DRAM state switching portion 121a, a DRAM operation controlling portion 121b, a DRAM state identifying portion 121c and a reserved state controlling portion 121d. The DRAM state identifying portion 121c identifies the current operating state of the internal DRAM 100 by the information contained in the ATD signal and the WEB signal.

The reserved state controlling portion 121d determines the width of a reserved (RESERVED) state period of the internal DRAM 100, in accordance with the operating state of the internal DRAM 100 and the length of the time elapsed from the ATD signal being activated. The DRAM operation controlling portion 121b controls the internal DRAM 100 to perform an access operation such as a read operation, a write operation or a refresh operation, after the RESERVED state period of the internal DRAM 100 determined by the reserved state controlling portion 121d has lapsed. The DRAM state switching portion 121a switches the operating state of the internal DRAM 100, in response to the DTD, ATD or WEB signal.

Five operating states of the internal DRAM 100 in the SRAM compatible memory device are designated as a READ state, a WRITE state, a REFRESH state, a RESERVED state and an IDLE state. When the DRAM is in the READ state, the operation of reading out data is performed. In the WRITE state, the operation of writing externally input data in the DRAM memory array 101 is performed. In the REFRESH state, the operation of amplifying the data stored in the DRAM memory array 101 and rewriting the same is performed. In the RESERVED state, the refresh operation can be allocated to the internal DRAM 100. The fifth state of the DRAM 100, the IDLE state, is a state other than the READ state, the WRITE state, the REFRESH state and the RESERVED state, that is, a state in which no operation is performed.

Various operations of the SRAM compatible memory device according to the invention will now be described with reference to FIGS. 2 through 11.

Figure 2:
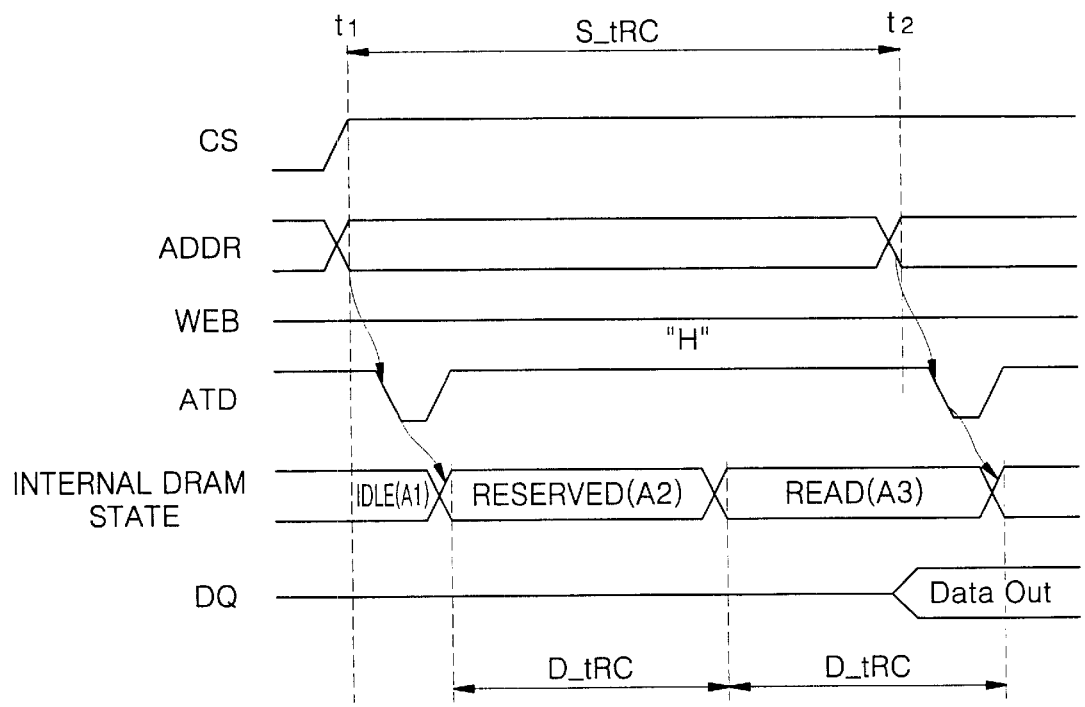
FIG. 2 is a timing diagram illustrating an example of when a read operation is performed from an idle (IDLE) state.

FIG. 2 is a timing diagram illustrating an example of initiating a read operation from an idle (IDLE) state. If an address ADDR primarily is input at a time t1, an ATD signal is generated as a pulse. The internal DRAM 100 is switched from an IDLE state (A1) to a RESERVED state (A2). Successively, if a predetermined DRAM access time (period) D_tRC has elapsed, the internal DRAM 100 is switched from the RESERVED state (A2) to a READ state (A3), and reads out data for the duration of the access time D_tRC, to be output.

If an SRAM access time S_tRC, of a period from the leading ADDR input time t1 to the lagging ADDR input time t2, is longer than twice the DRAM access time D_tRC, the SRAM compatible memory device according to the invention performs a read operation in the same manner as the conventional SRAM does.

In FIG. 2, activation of a CS signal to a logic "high" indicates that the internal DRAM 100 has entered a state in which it is capable of performing read/write access and refresh operations. The "high" state of the WEB signal indicates a READ state, and the "low" state thereof indicates a WRITE state. For convenience of explanation, an explanation of the CS and WEB signals is omitted.

Figure 3:
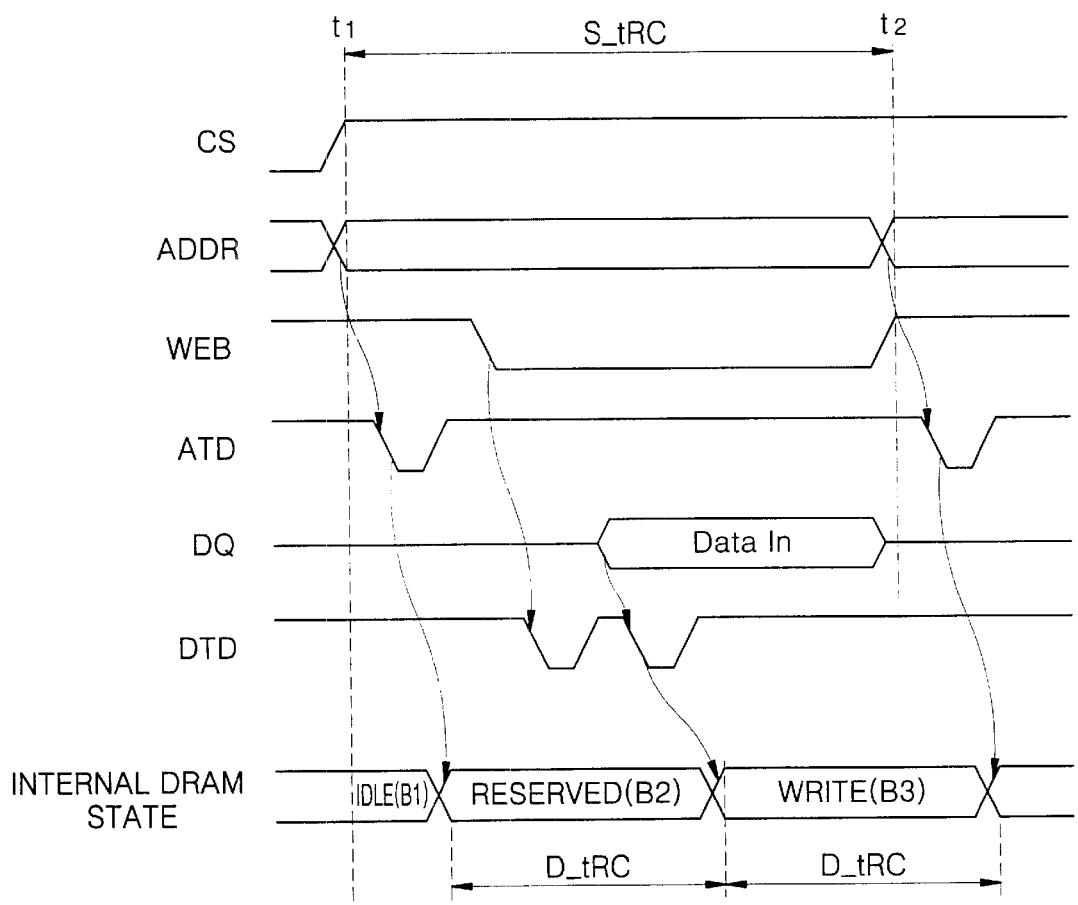
FIGS. 3 through 5 are timing diagrams illustrating examples of when write operations are performed from an idle (IDLE) state.

FIG. 3 is a timing diagram illustrating an example of initiating a write operation from an idle (IDLE) state. Like in the READ operation shown in FIG. 2, the internal DRAM 100 is switched from an IDLE state (B1) to a RESERVED state (B2). After the lapse of the DRAM access time D_tRC, the internal DRAM 100 is further switched to a WRITE state (B3) to perform a data write operation. Here, a DTD signal is activated with a predetermined pulse width responsive to activation of a WEB signal and input of data. In other words, the internal DRAM 100 identifies a WRITE state by the first pulse of the DTD signal responsive to activation of the WEB signal. Also, the internal DRAM 100 writes valid data by the second pulse of the DTD signal responsive to input of data. In this case as shown in FIG. 3, like in FIG. 2, when an SRAM access time S_tRC is longer than twice the DRAM access time D_tRC, the SRAM compatible memory device according to the invention performs a write operation in the same manner as does the conventional SRAM.

Figure 4:
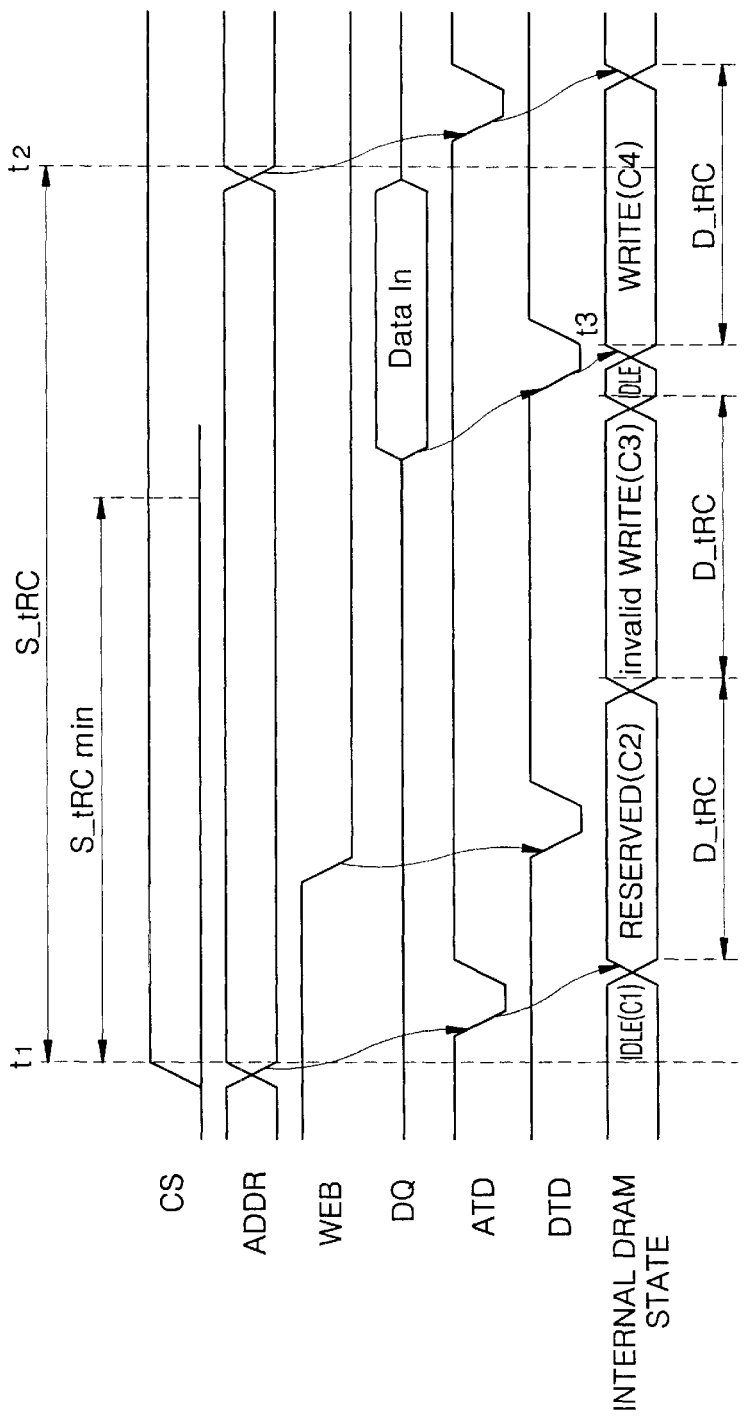

FIG. 4 is a timing diagram illustrating another example of initiating a write operation from an idle (IDLE) state. A WEB signal is activated within a DRAM access time D_tRC following a leading ADDR input time t1. However, data is input after a period twice the DRAM access time D_tRC.

In FIG. 4, the internal DRAM 100 is switched to a RESERVED state (C2) in response to an ATD signal. After the lapse of the DRAM access time D_tRC, the internal DRAM 100 is further switched to a first WRITE state (C3) to perform a data write operation. However, in the first WRITE state (C3), data is not input. Thus, in the first WRITE state (C3), an invalid WRITE operation is performed, that is, invalid data is input. Thereafter, at a time t3, responsive to the input of data, the internal DRAM 100 is switched to a WRITE state (C4) in which valid data is written. Here, a SRAM access time S_tRC, that is, a time period from the leading ADDR input time t1 to a lagging ADDR input time t2, is longer than twice the DRAM access time D_tRC, that is, longer than the minimum SRAM access time S_tRCmin. If such conditions of ADDR input, WEB signal input and data input as shown in FIG. 4 are allowed in the conventional SRAM, the SRAM compatible memory device according to the invention will satisfactorily perform an access operation such as a write operation, in the same manner as does the conventional SRAM.

Figure 5:
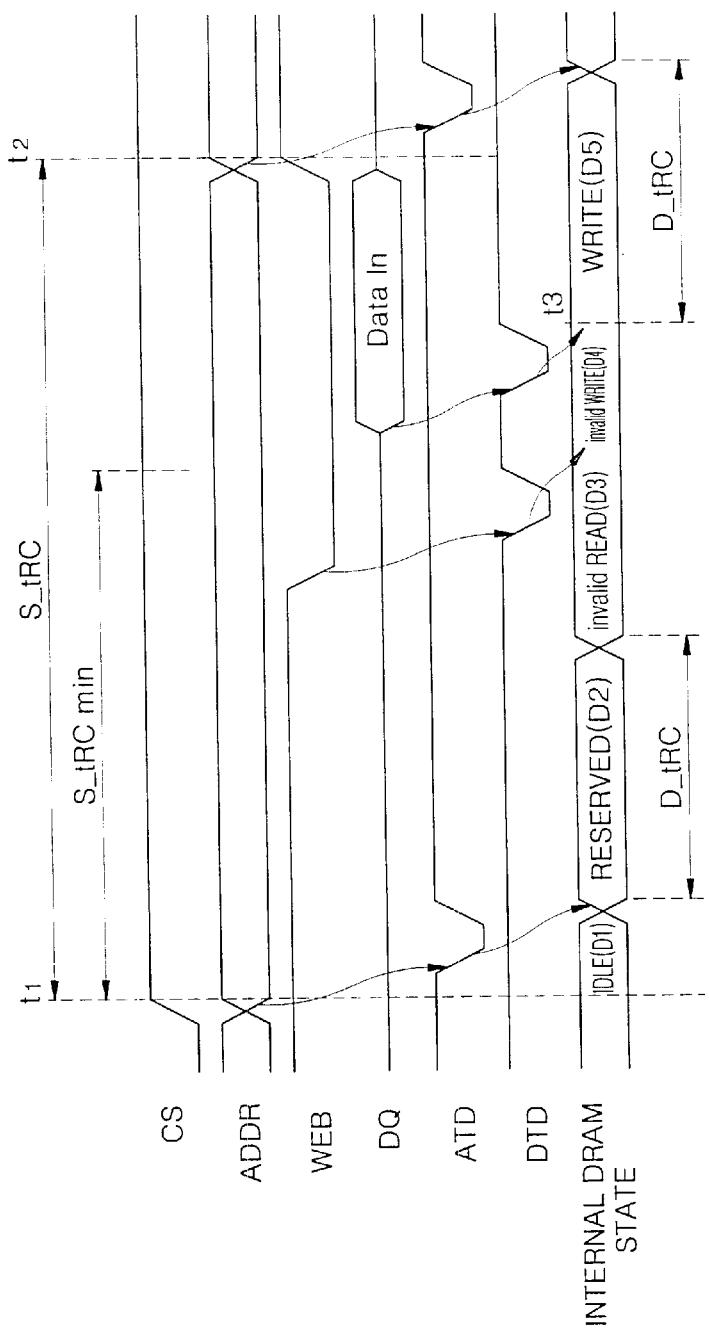

FIG. 5 is a timing diagram illustrating still another example of initiating a write operation from an idle (IDLE) state. A WEB signal is activated during a DRAM access time D_tRC following a leading address ADDR input time t1. Also, data is input during a period twice the length of the DRAM access time D_tRC following the leading address ADDR input time.

The internal DRAM 100 is switched to a RESERVED state (D2) in response to an ATD signal. After the lapse of the DRAM access time D_tRC, the internal DRAM 100 is switched to a READ state (D3). The reason for the switch to the READ state (D3) is that the WEB signal is not yet activated to a logic "low". However, the READ state (D3) is subsequently changed to an invalid READ state in which invalid data is read out.

If the WEB signal is activated to a logic "low", the internal DRAM 100 is switched to a first WRITE state (D4) to perform a write operation. However, since no data is input in the first WRITE state (D4), an invalid WRITE operation is performed. Thereafter, at a time t3, responsive to the input of data, the internal DRAM 100 is switched to a second WRITE state (D5) in which valid data is written.

In FIG. 5, an SRAM access time S_tRC is longer than the minimum SRAM access time S_tRCmin. However, if such rules of WEB signal input and data input as shown in FIG. 5 were allowed in the conventional SRAM, the SRAM compatible memory device according to the invention will satisfactorily perform an access operation such as a write operation, as does the conventional SRAM.

Figure 6:
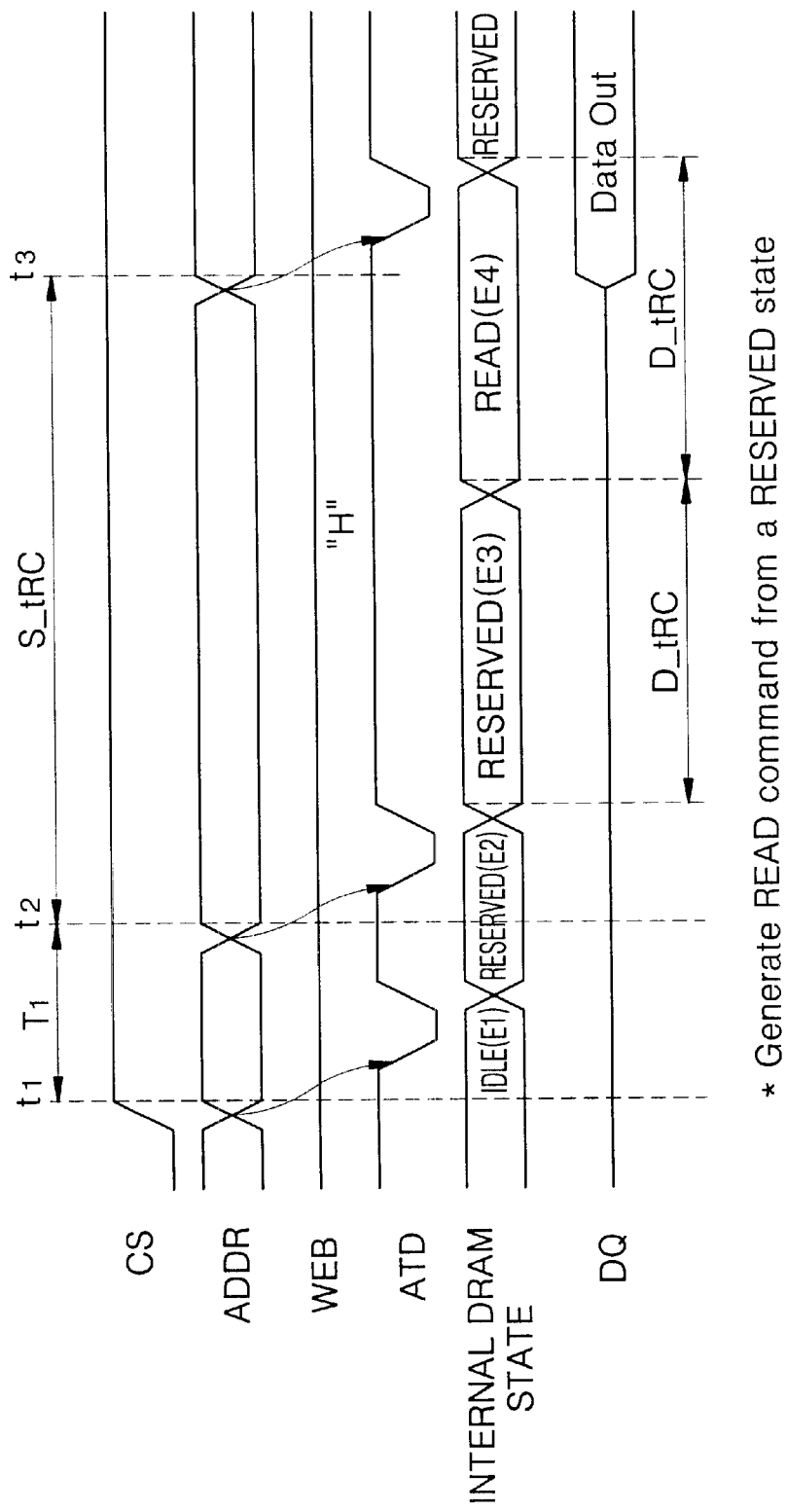
FIGS. 6 and 7 are timing diagrams illustrating examples of when read and write operations are performed from a reserved (RESERVED) state.

FIG. 6 is a timing diagram illustrating an example of performing a read operation from a reserved (RESERVED) state, in which a lagging address ADDR is input at a time t2 prior to a DRAM access time D_tRC following a time t1 at which a leading ADDR is input.

First, if the leading ADDR primarily is input at the time t1, the internal DRAM 100 is switched from an IDLE state (E1) to a RESERVED state (E2) in response to generation of an ATD signal. However, during the period of the RESERVED state (E2), the lagging ADDR is secondarily input at the time t2. In other words, a time interval (T1) from the time t1 and the time t2 is shorter than the DRAM access time D_tRC. Then, the ATD signal is again generated and the internal DRAM 100 is further switched to a RESERVED state (E3). Thereafter, the internal DRAM 100 operates such that if a predetermined access time D_tRC has elapsed, the internal DRAM 100 is switched from the RESERVED state (E3) to a READ state (E4). And the data is read out for the duration of the access time D_tRC, to then be output.

Figure 7:
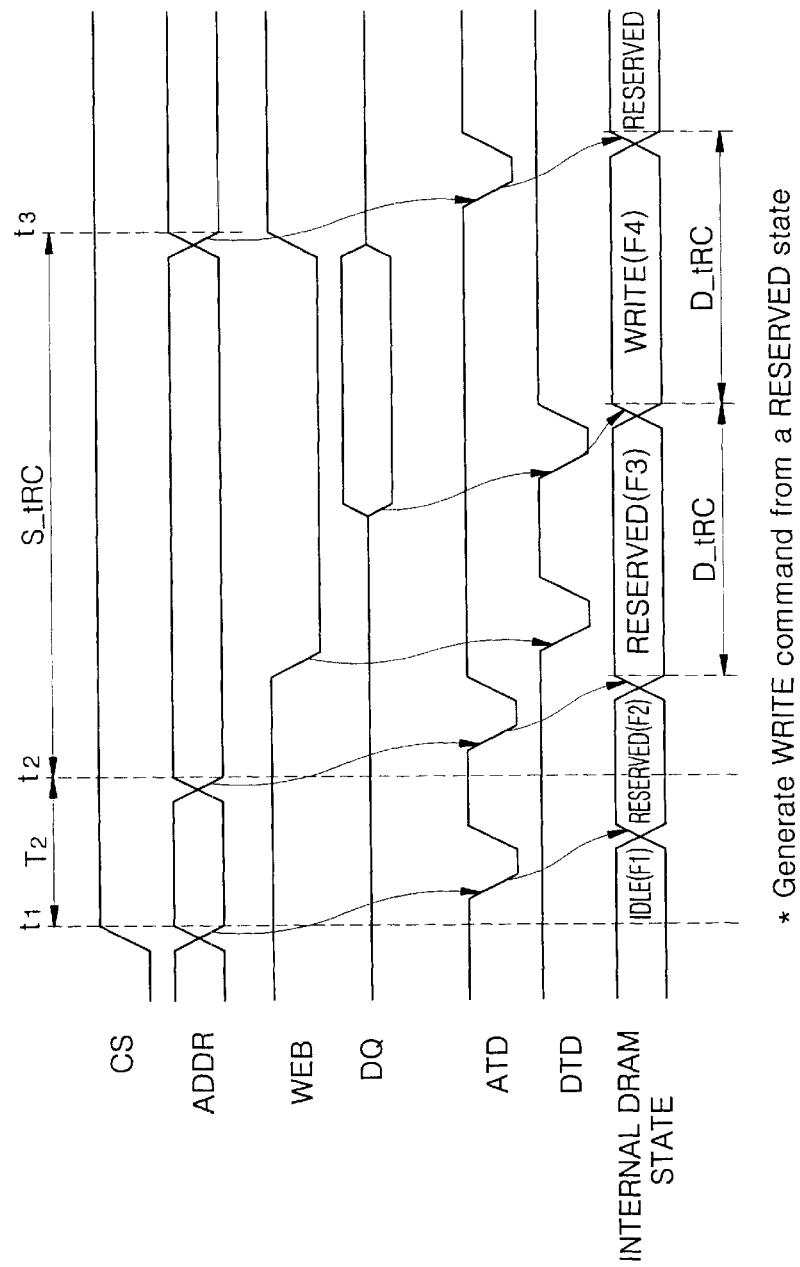

FIG. 7 is a timing diagram illustrating an example of performing a write operation from a reserved (RESERVED) state. Like in FIG. 6, a lagging address ADDR is input at a time t2 prior to a DRAM access time D_tRC following a time t1 at which a leading ADDR is input. Thus, similarly to the case shown in FIG. 6, the internal DRAM 100 is switched to a WRITE state (F4) after two RESERVED states (F2 and F3).

Figure 8:
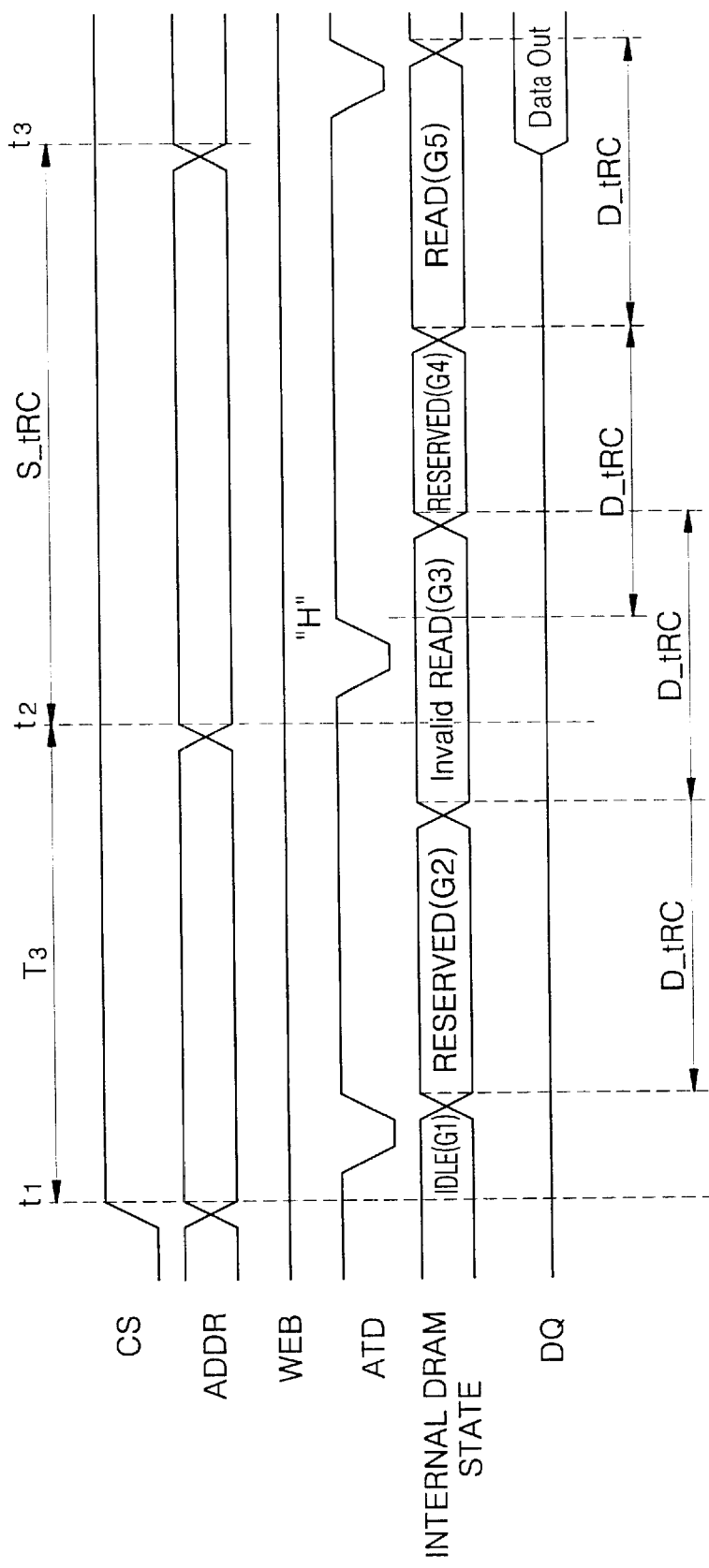
FIG. 8 is a timing diagram for a case in which a read command is further generated from a read (READ) state.

FIG. 8 is a timing diagram illustrating the case in which a read command is further generated from a read (READ) state, in which a lagging address ADDR is input at a time t2 that comes after a DRAM access time D_tRC from a leading ADDR input time t1, and comes prior to a time which is twice the time D_tRC.

First, if the leading address ADDR is primarily input at the time t1, an ATD signal is generated as a pulse. Then, the internal DRAM 100 is switched from an IDLE state (G1) to a RESERVED state (G2) in response to generation of the ATD signal. Continuously, if a predetermined DRAM access time D_tRC has elapsed, the internal DRAM 100 is switched from the RESERVED state (G2) to a READ state (G3) to remain in the READ state (G3) for the duration of the access time D_tRC. However, as shown in FIG. 8, the lagging ADDR is input at the time t2 while the DRAM is in the READ state (G3). Then, the ATD signal is generated as a pulse. If the READ state (G3) is terminated, the internal DRAM 100 is further switched to a RESERVED state (G4). Then, if the access time D_tRC has elapsed after the ATD signal is generated, the internal DRAM 100 is switched to a READ state (G5) to perform a read operation.

Figure 9:
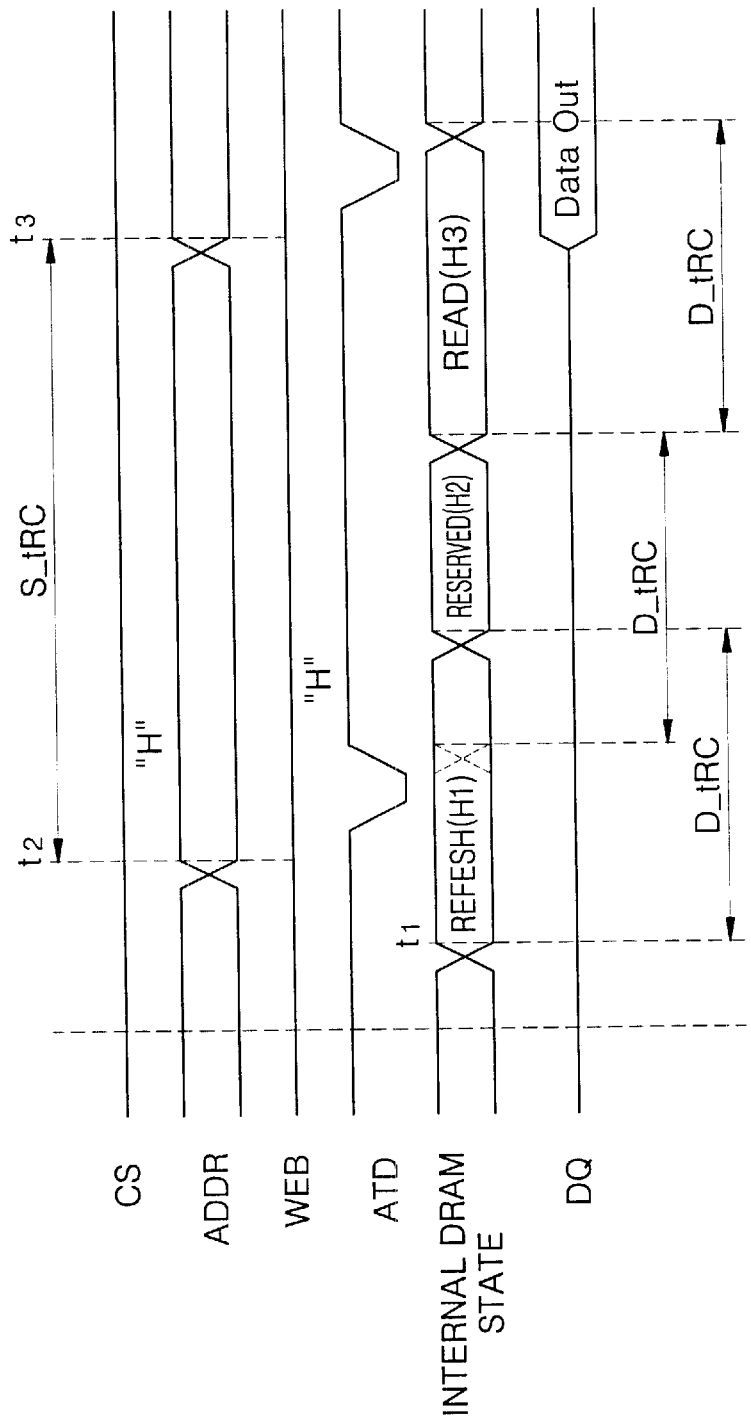
FIG. 9 is a timing diagram for a case in which a read command is generated from a refresh (REFRESH) state.

FIG. 9 is a timing diagram illustrating the case in which a read command is generated from a refresh (REFRESH) state of the DRAM. In FIG. 9, the REFRESH state (H1) is initiated at a time t1 and an address ADDR is input at a time t2 prior to completion of a REFRESH state (H2). Then, if during the REFRESH state (H1) a DRAM access time D_tRC elapses, the internal DRAM 100 is switched to the RESERVED state (H2). Also, if another DRAM access time D_tRC elapses after generation of an ATD signal, the internal DRAM 100 is switched from the RESERVED state (H2) to a READ state (H3). Continuously, the READ state (H3) is held for the duration of the access time D_tRC.

Figure 10:
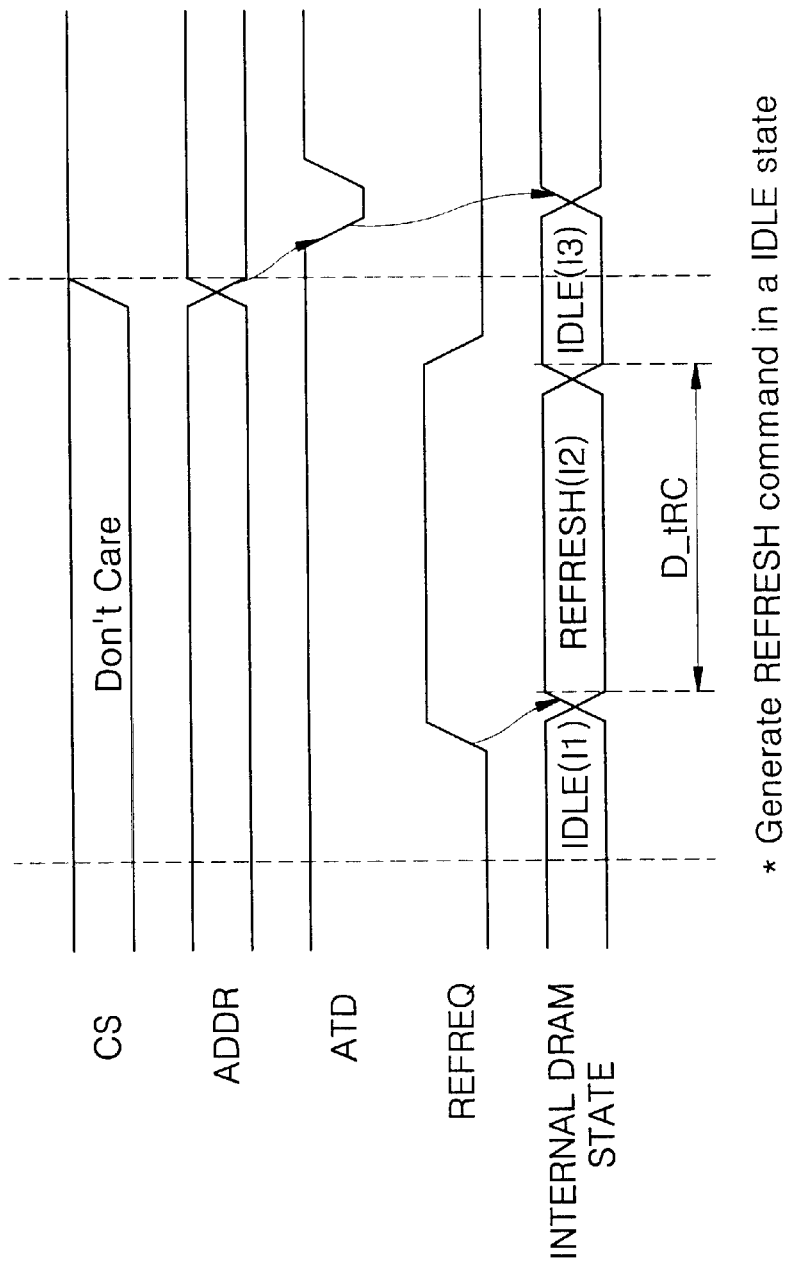
FIG. 10 is a timing diagram illustrating an example of generating a refresh command from an idle (IDLE) state.

FIG. 10 is a timing diagram illustrating an example of generating a refresh command from an idle (IDLE) state, in which the refresh request (REFREQ) signal generated from the refresh timer (119 of FIG. 1) is activated during an IDLE state (I1). Then, the internal DRAM 100 is switched to a REFRESH state (I2) in response to the REFREQ signal. The activation of the REFREQ signal may occur irrespective of the logical state of a CS signal. After the REFRESH state (I2) is held for the duration of the access time D_tRC, the internal DRAM 100 is switched again to an IDLE state (I3).

Figure 11:
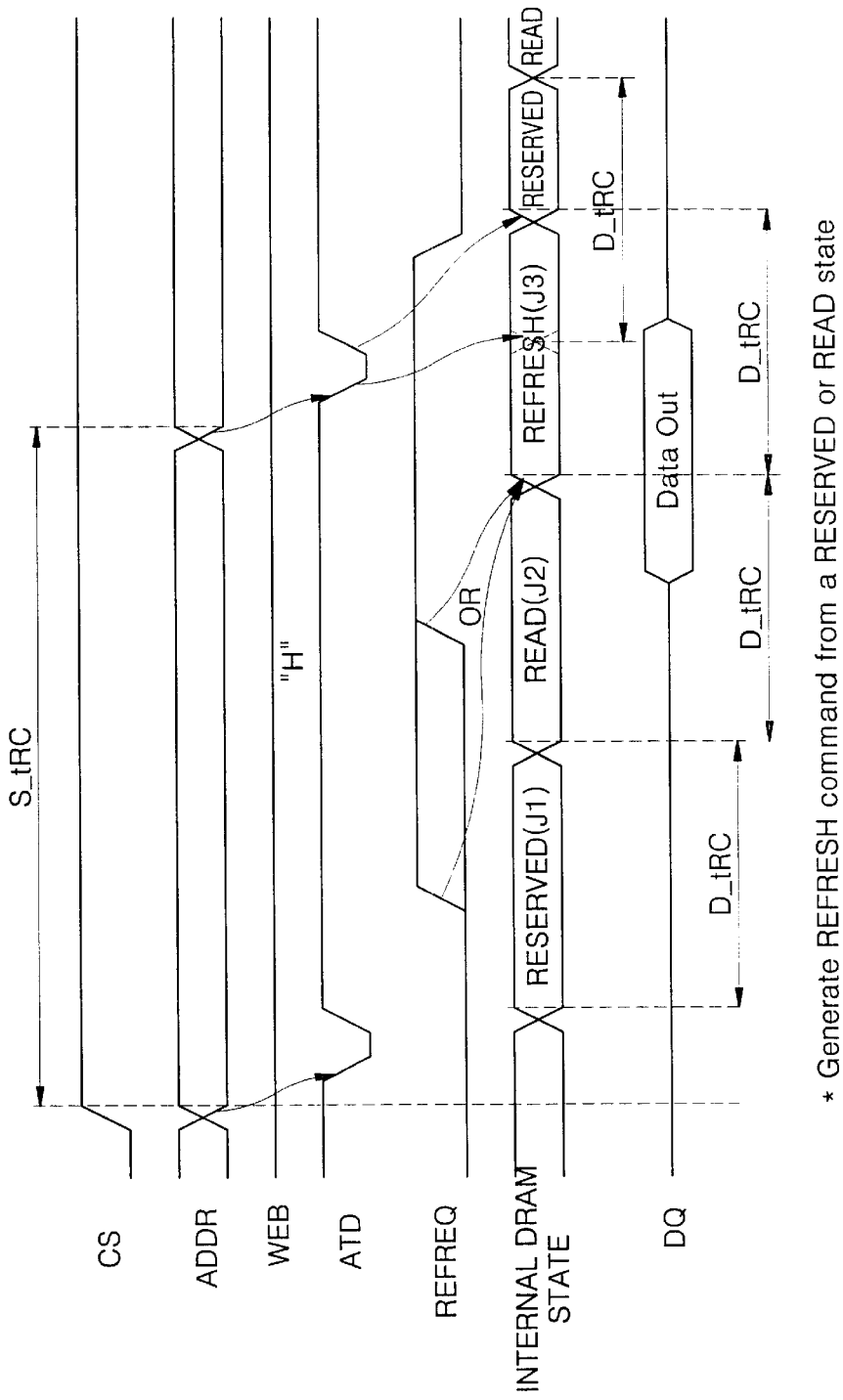
FIG. 11 is a timing diagram illustrating an example of when a refresh command is generated from a reserved (RESERVED) state or a read (READ) state.

FIG. 11 is a timing diagram illustrating an example of generating a refresh command from a reserved (RESERVED) or read (READ) state. First, if an address ADDR is input and an ATD signal is then activated, the SRAM compatible memory device according to the invention enters a RESERVED state (J1). Even if a REFREQ signal is activated to a logic "high" in the RESERVED state (J1), the RESERVED state (J1) and a READ state (J2) are held for the duration of the access time D_tRC and another (following) access time D_tRC, respectively. After the READ state (J2) is terminated, a REFRESH state (J3) is then started. Also, even if the REFREQ signal is activated to a logic "high" in the READ state (J2), the REFRESH state (J3) is started after the READ state (J2), held for the duration of access time D_tRC, is terminated.

Figure 12:
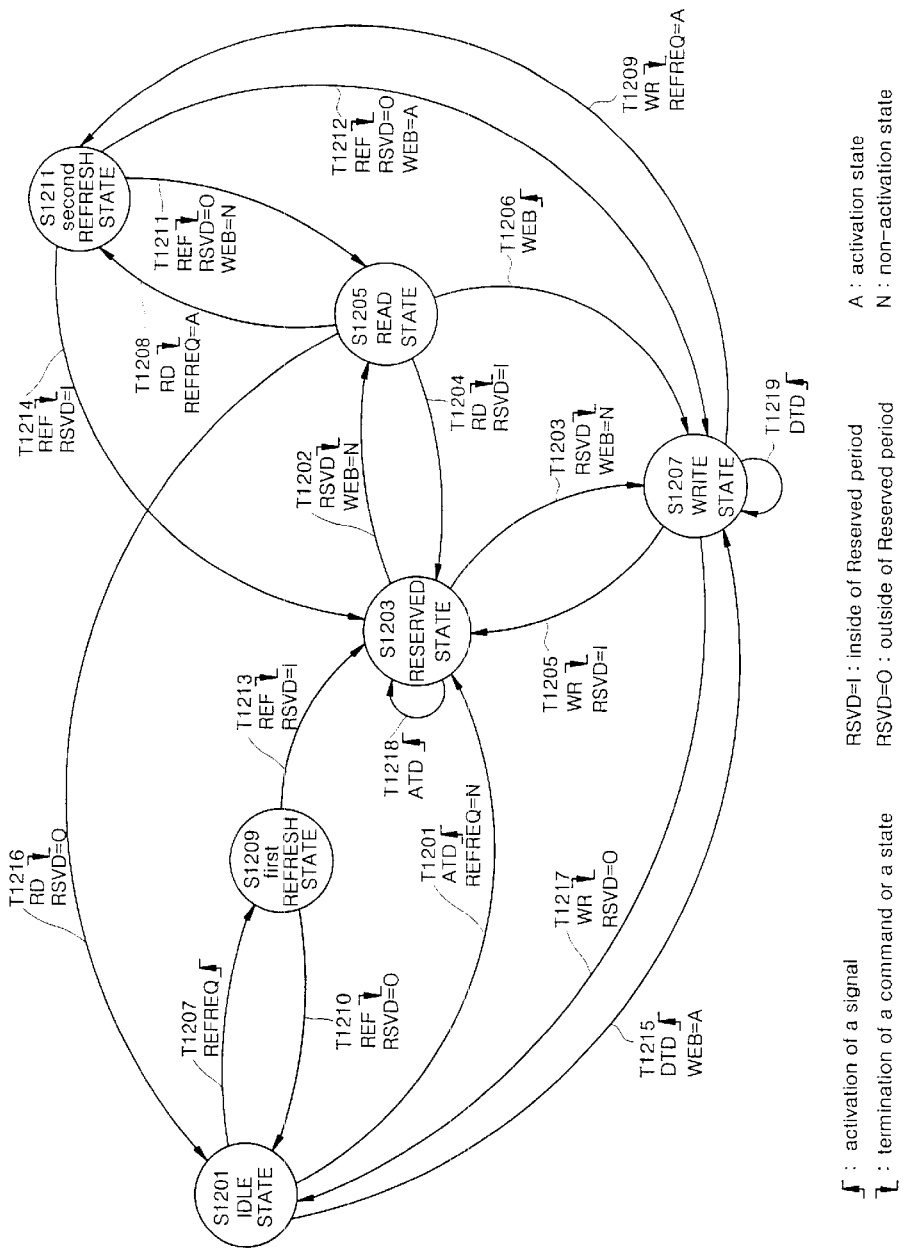
FIG. 12 is a state transition diagram of the internal DRAM in an SRAM compatible memory device according to an embodiment of the invention.

FIG. 12 shows conceptually a state transition scheme of the internal DRAM, which is shown in detail in FIG. 2 to FIG. 11. Referring to FIG. 1 and FIG. 12, the state transition scheme of the internal DRAM will be summarized.

Figure 14A:
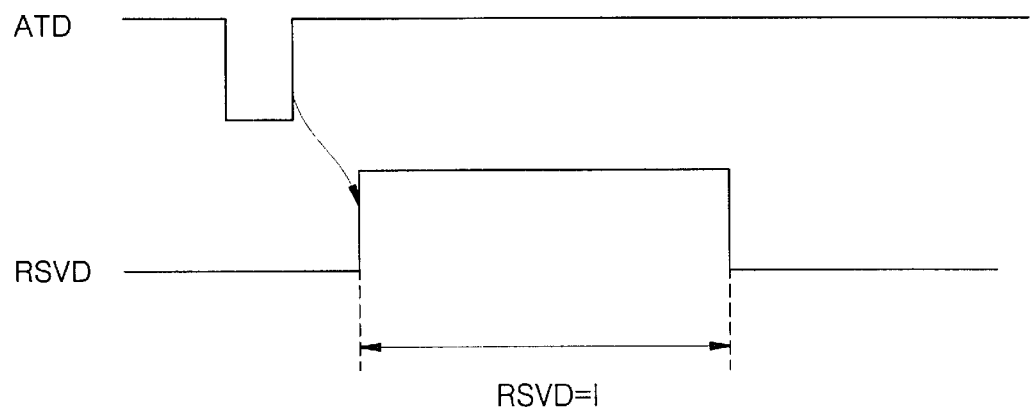
FIG. 14A and FIG. 14B are timing diagrams for explaining a reserved period.
Figure 14B:
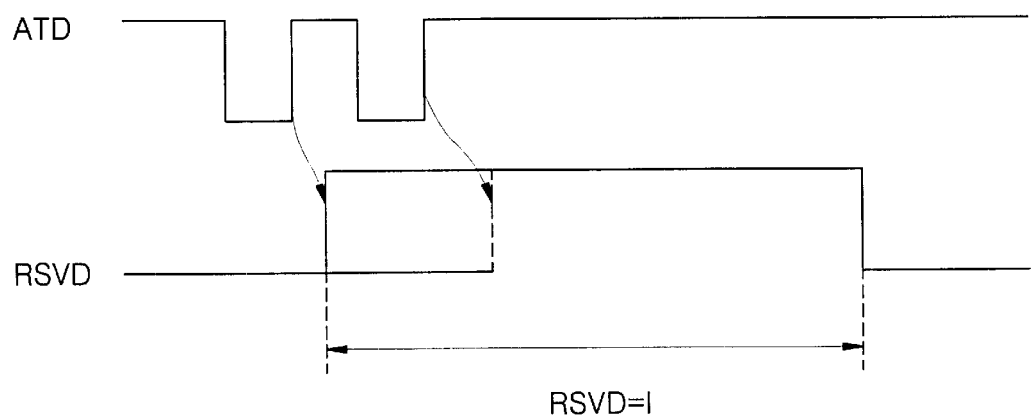

When the activation of the ATD signal is generated from an idle state S1201, the internal DRAM 100 is switched to a reserved state S1203, at transition T1201. If the WEB signal is in non-activation when the reserved state S1203 is terminated, the internal DRAM 100 is switched to a read state S1205, at transition T1202. If the WEB signal is in activation when the reserved state S1203 is terminated, the internal DRAM 100 is switched to a write state S1207, at transition T1203. If the read state S1205 or the write state S1207 is terminated within a reserved period RSVD=I, the internal DRAM 100 is switched to the reserved state S1203, at transition T1204 or T1205. The reserved period is a predetermined time interval of the reserved state from the activation of the ATD signal, which is illustrated in FIG. 14A and FIG. 14B. In this specification, RSVD=I means the inside of the reserved period, while RSVD=O means the outside of the reserved period.

When the activation of the WEB signal is generated from the read state S1205, the internal DRAM 100 is switched to the write state S1207, at transition T1206. If the activation of the REFREQ signal is generated from the idle state S1201, the internal DRAM 100 is switched to a first refresh state S1209, at transition T1207. However, if the activation of the REFREQ signal is generated from the read state S1205 or the write state S1207, the internal DRAM 100 is switched to a second refresh state S1211 after the completion of the read state S1205 or the write state S1207, at transition T1208 or T1209. In this specification the refresh state is shown as the first and the second refresh state S1209 and S1211, because the transition conditions from the first and the second refresh state S1209 and S1211 to the other state are different. If the first refresh state S1209 is terminated in the outside of the reserved period RSVD=O, the internal DRAM 100 is switched to the idle state S1201, at transition T1210. However, in the case of the second refresh state, the internal DRAM 100 is switched to the read state S1205 or the write state S1207 according to the whether the WEB signal is activated or not, at transition T1211 or T1212, in spite of the second refresh state being terminated in the outside of the reserved period RSVD=O. When the first refresh state S1209 or the second refresh state S1211 is terminated in the inside of the reserved period RSVD=I, the internal DRAM 100 is switched to the reserved state S1203, at transition T1213 or T1214.

If the WEB signal is in activation when the activation of the DTD signal is generated from the idle state S1201, the internal DRAM 100 is switched to the write state S1207, at transition T1215. When the read state S1205 or the write state S1207 is terminated in the outside of the reserved period RSVD=O, the internal DRAM 100 is switched to the idle state S1201, at transition T1216 or T1217.

If the activation of the ATD signal is generated from the reserved state S1203, the internal DRAM 100 is maintained with the reserved state S1203, at transition T1218. If the activation of the DTD signal is generated from the write state S1207, the internal DRAM 100 is maintained in the write state S1207, at transition T1218.

Figure 13:
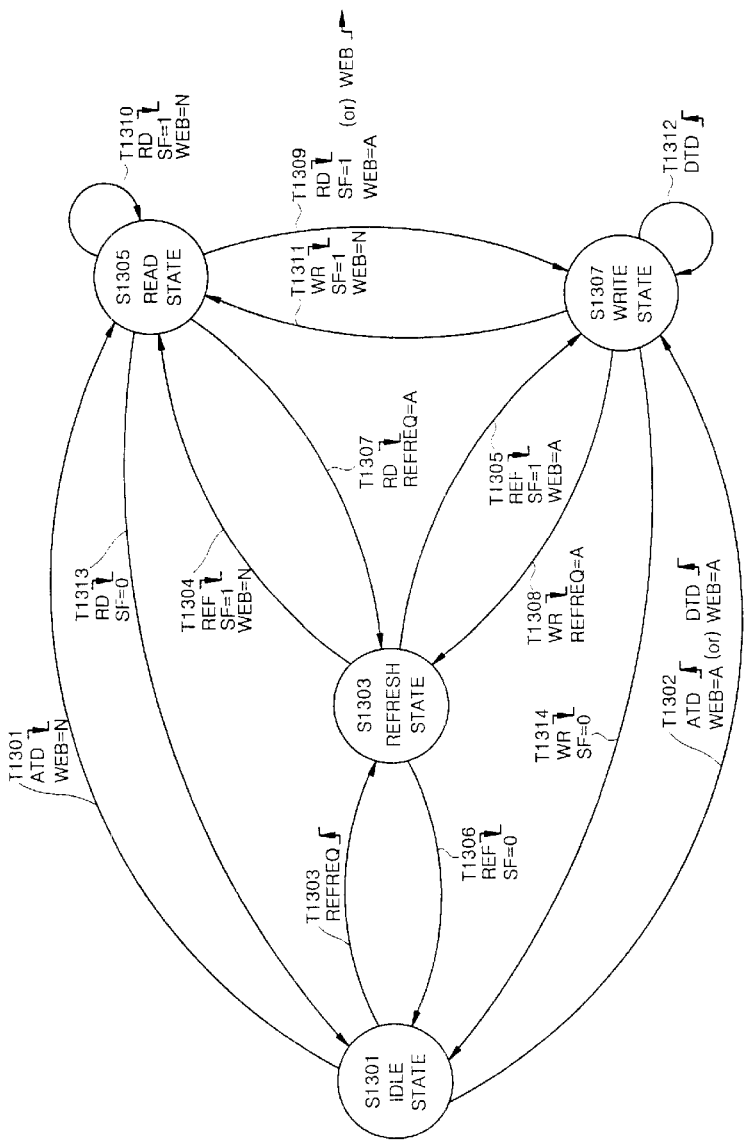
FIG. 13 is a state transition diagram of the internal DRAM in an SRAM compatible memory device according to another embodiment of the invention.

FIG. 13 is a state transition diagram of the internal DRAM in an SRAM compatible memory device according to another embodiment of the invention. Referring to FIG.13, a read state or a write state is generated in advance of a refresh state. The state transition scheme of the internal DRAM in an SRAM compatible memory device according to this other embodiment of the invention will be described below.

If the WEB signal is in non-activation when the activation of the ATD signal is generated from an idle state S1301, the internal DRAM 100 is switched to a read state S1305, at transition T1301. If the WEB signal is in activation when the activation of the ATD signal or the DTD signal is generated from an idle state S1301, the internal DRAM 100 is switched to a write state S1307, at transition T1302. When the activation of the REFREQ signal is generated from an idle state S1301, the internal DRAM 100 is switched to a refresh state S1303, at transition T1303. If the successive flag SF is 1 when the refresh state S1303 is terminated, the internal DRAM 100 is switched to a read state S1305 or a write state S1307 depending on the activation of the WEB signal, at transition T1304 or T1305. The successive flag SF is set as 1 when the activation of the signal ATD is generated during a READ, WRITE or REFRESH operation. The successive flag SF is set as 0 when a read operation, a write operation or a refresh operation starts.

If the successive flag SF is 0 when the refresh state S1303 is terminated, the internal DRAM 100 is switched to the idle state S1301, at transition T1306. If the REFREQ signal is in activation when the read state S1305 or the write state S1307 is terminated, the internal DRAM 100 is switched to the refresh state S1301, at transition T1307 or T1308. If the successive flag SF is 1 and the WEB signal is in activation when the read state S1305 is terminated, the internal DRAM 100 is switched to the write state S1307, at transition T1309. If the successive flag SF is 1 and the WEB signal is in non-activation when the read state S1305 is terminated, the internal DRAM 100 is maintained in the write state S1307, at transition T1310.

If the successive flag SF is 1 and the WEB signal is in non-activation when the write state S1307 is terminated, the internal DRAM 100 is switched to the read state S1305, at transition T1311. If the successive flag SF is 1 and the WEB signal is in activation when the write state S1307 is terminated, the internal DRAM 100 is maintained in the read state S1305, at transition T1312. If the successive flag SF is 0 when the read state S1305 or the write state S1307 is terminated, the internal DRAM 100 is switched to the idle state S1301, at transition T1313 or T1314.

In the embodiment shown in FIG. 12, a reserved state capable of a refresh operation is generated in advance of a read state or a write state. However, in the other embodiment, shown in FIG.13, a read state or a write state is generated in advance of a refresh.

In the invention, in order to implement a memory that is fully compatible with an asynchronous SRAM, a DRAM memory cell is operated twice within an access time of an SRAM. For example, in order to implement an asynchronous SRAM having an access time of 70 ns, the internal DRAM 100 is configured to have an access time of 35 ns or less and the internal DRAM 100 is operated twice, for a period of 70 ns. During the first period of access time of the internal DRAM 100, no operation is performed, or a refresh operation is performed. However, during the second period of access time of the internal DRAM 100, read/write operations are performed.

While the invention has been described with reference to specific embodiments, the description is illustrative of the invention and is not to be construed as limiting the invention. It will be understood by those skilled in the art that various modifications may occur to those skilled in the art without departing from the spirit and scope of the invention. It is, therefore, intended that the true spirit and scope of the invention be defined by the appended claims and their equivalents.

What is claimed is:

1. An SRAM compatible memory device in which a leading address is primarily input and then a lagging address is secondarily input after a predetermined SRAM access time, during which valid data is accessed from the outside, the SRAM compatible memory device comprising:

a DRAM memory array having a plurality of DRAM memory cells arranged in rows and columns, each DRAM memory cell requiring a refresh operation within a predetermined refresh period for retention of data stored; and a DRAM operation controller for controlling the DRAM memory array to initiate an actual access operation after a predetermined DRAM access time has elapsed from a time at which the leading address is primarily input, wherein the SRAM access time is equal to or longer than twice the DRAM access time.

2. The SRAM compatible memory device according to claim 1, wherein a reserved state in which allocation of the refresh operation is allowed, is maintained during the DRAM access time from the time at which the leading address is primarily input.

3. The SRAM compatible memory device according to claim 2, wherein if the refresh operation is requested in the reserved state, the refresh operation is performed during the DRAM access time after completion of the access operation of the DRAM memory array.

4. The SRAM compatible memory device according to claim 2, wherein if the refresh operation is requested during the access operation of the DRAM memory array, the refresh operation is performed during the DRAM access time after the completion of the access operation of the DRAM memory array.

5. The SRAM compatible memory device according to claim 1, wherein the DRAM operation controller comprises:

a DRAM state identifying portion receiving an address transition detection signal generated in response to input of the address and a write enable signal, and identifying the operating state of the DRAM memory array;

a reserved state controlling portion controlling a reserved state period of the DRAM in accordance with the operating state of the DRAM identified by the DRAM state identifying portion and the address transition detection signal;

a DRAM operation controlling portion controlling the DRAM to perform an access operation after lapse of the reserved state period of the DRAM controlled by the reserved state controlling portion; and a DRAM state switching portion receiving a data transition detection signal generated in response to input of predetermined data, the address transition detection signal and the write enable signal, and switching the operating state of the DRAM memory array.

6. The SRAM compatible memory device according to claim 1, wherein the SRAM access time is shorter than the sum of a refresh time for refreshing the DRAM memory cells and twice the DRAM access time.

7. The SRAM compatible memory device according to claim 1, wherein the SRAM access time is shorter than the sum of twice a refresh time for refreshing the DRAM memory cells and the DRAM access time.

8. An SRAM compatible memory device having a DRAM memory array, the array having a plurality of DRAM memory cells arranged in rows and columns, each DRAM memory cell requiring a refresh operation within a predetermined refresh period for retention of data stored, wherein a leading address is primarily input and then a lagging address is secondarily input after a predetermined SRAM access time has elapsed, for accessing valid data from outside the device, and the SRAM access time is equal to or longer than the sum of a refresh time for refreshing the DRAM memory cells and a DRAM access time for effectively accessing the DRAM memory cells.

9. The SRAM compatible memory device according to claim 8, wherein the SRAM access time is shorter than the sum of the refresh time and twice the DRAM access time.

10. The SRAM compatible memory device according to claim 8, wherein the SRAM access time is shorter than the sum of twice the refresh time and the DRAM access time.

11. A method of driving an SRAM compatible memory device having a DRAM memory array, the array including a plurality of DRAM memory cells arranged in rows and columns, each DRAM memory cell requiring a refresh operation within a predetermined refresh period for retention of data stored, the method comprising the steps of:

(a) inputting a leading address designating at least one of the plurality of memory cells;

(b) generating an address transition detection signal in response to the input leading address;

(c) allowing a predetermined DRAM access time to elapse after the generation of the address transition detection signal;

(d) performing an access to the DRAM memory array for the duration of the DRAM access time after step (c); and (e) inputting a lagging address different from the leading address after lapse of a predetermined SRAM access time from the leading address input time, wherein the SRAM access time is equal to or longer than twice the DRAM access time.

12. The method according to claim 11, wherein step (c) comprises the sub-step (c1) of maintaining a reserved state in which the DRAM memory array is capable of allocating the refresh operation.

13. The method according to claim 12, further comprising the steps of:
issuing a refresh request to the DRAM memory array when in the reserved state; and
performing the refresh operation of the DRAM memory array after step (d).

14. The method according to claim 12, further comprising the steps of:
issuing a refresh request to the DRAM memory array during the access to the DRAM memory array; and
performing the refresh operation on the DRAM memory array after step (d).

15. The method according to claim 12, further comprising the step of inputting data, wherein step (d) is performed immediately after step (c) if the input of data occurs within the DRAM access time from the leading address input time.

16. The method according to claim 12, further comprising the step of inputting data, wherein step (d) is performed in response to the input of data if the input of data occurs after the DRAM access time from the leading address input time.

17. The method according to claim 11, wherein the SRAM access time is shorter than the sum of a refresh time for refreshing the DRAM memory cells and twice the DRAM access time.

18. The method according to claim 11, wherein the SRAM access time is shorter than the sum of twice a refresh time for refreshing the DRAM memory cells and the DRAM access time.

19. A method of driving an SRAM compatible memory device having a DRAM memory array, the array including a plurality of DRAM memory cells arranged in rows and columns, each DRAM memory cell requiring a refresh operation within a predetermined refresh period for retention of data stored, the method comprising the steps of:

(a) performing a primary access of at least one of the plurality of memory cells;

(b) inputting a leading address designating at least the other of the plurality of memory cells while performing the primary access;

(c) generating an address transition detection signal in response to the input leading address;

(d) performing a secondary access of the DRAM memory array after the primary access has terminated and the address transition detection signal is generated;

(e) inputting a lagging address after a predetermined SRAM access time from the leading address input time has lapsed,
wherein the SRAM access time is equal to or longer than twice the DRAM access time.

20. The method according to claim 19, wherein the SRAM access time is shorter than the sum of a refresh time for refreshing the DRAM memory cells and twice the DRAM access time.

21. The method according to claim 19, wherein the SRAM access time is shorter than the sum of twice a refresh time for refreshing the DRAM memory cells and the DRAM access time.

22. A method for driving an SRAM compatible memory device having a DRAM memory array, the array including a plurality of DRAM memory cells arranged in rows and columns, each DRAM memory cell requiring a refresh operation within a predetermined refresh period for retention of data stored, the method comprising the steps of:

(a) initiating the refresh operation;

(b) inputting a leading address designating at least the other of the plurality of memory cells while performing the refresh operation;

(c) generating an address transition detection signal in response to the input leading address;

(d) performing an access of the DRAM memory array after the refresh operation is terminated and the address transition detection signal is generated;

(e) inputting a lagging address after lapse of a predetermined SRAM access time from the leading address input time,
wherein the SRAM access time is equal to or longer than twice the DRAM access time.

23. The method according to claim 22, wherein the SRAM access time is shorter than the sum of a refresh time for refreshing the DRAM memory cells and twice the DRAM access time.

24. The method according to claim 22, wherein the SRAM access time is shorter than the sum of twice a refresh time for refreshing the DRAM memory cells and the DRAM access time.

25. An SRAM compatible memory device in which a leading address is primarily input and then a lagging address is secondarily input after a predetermined SRAM access time, the SRAM access time being elapsed for accessing valid data from outside the device, the SRAM compatible memory device comprising:

a DRAM memory array having a plurality of DRAM memory cells arranged in rows and columns, each DRAM memory cell requiring a refresh operation within a predetermined refresh period for retention of data stored; and a DRAM operation controller for controlling the DRAM memory array to start an actual access operation during a predetermined DRAM access time, in response to the input of leading address, the DRAM operation controller controlling the DRAM memory array to input the lagging address after another the DRAM access time from a time at which the actual operation is completed, wherein the SRAM access time is equal to or longer than twice the DRAM access time.

26. The SRAM compatible memory device according to claim 25, wherein the SRAM access time is shorter than the sum of a refresh time for refreshing the DRAM memory cells and twice the DRAM access time.

27. The SRAM compatible memory device according to claim 25, wherein the SRAM access time is shorter than the sum of twice a refresh time for refreshing the DRAM memory cells and the DRAM access time.

28. A method for driving an SRAM compatible memory device having a DRAM memory array, the array including a plurality of DRAM memory cells arranged in rows and columns, each DRAM memory cell requiring a refresh operation within a predetermined refresh period for retention of data stored, the method comprising the steps of:

(a) inputting a leading address designating at least one of the plurality of memory cells;

(b) generating an address transition detection signal in response to the input leading address;

(c) performing an access of the DRAM memory array for the duration of the DRAM access time during a predetermined DRAM access time in response to the address transition detection signal;

(d) allowing another DRAM access time to elapse after step (c); and (e) inputting a lagging address different from the leading address after lapse of a predetermined SRAM access time from the leading address input time, wherein the SRAM access time is equal to or longer than twice the DRAM access time.

29. The method according to claim 28, wherein the SRAM access time is shorter than the sum of a refresh time for refreshing the DRAM memory cells and twice the DRAM access time.

30. The method according to claim 28, wherein the SRAM access time is shorter than the sum of twice a refresh time for refreshing the DRAM memory cells and the DRAM access time.

31. A method for driving an SRAM compatible memory device having a DRAM memory array, the array including a plurality of DRAM memory cells arranged in rows and columns, each DRAM memory cell requiring a refresh operation within a predetermined refresh period for retention of data stored, the method comprising the steps of:

(a) inputting a leading address designating at least one of the plurality of memory cells;

(b) generating an address transition detection signal in response to the input leading address;

(c) performing an access of the DRAM memory array for the duration of the DRAM access time during a predetermined DRAM access time in response to the address transition detection signal;

(d) generating a refresh request signal during step (c);

(e) performing the refresh operation in response to the refresh request signal for a refresh time for refreshing the DRAM memory cell after step (c); and (f) inputting a lagging address different from the leading address after lapse of a predetermined SRAM access time from the leading address input time, wherein the SRAM access time is equal to or longer than the sum of the DRAM access time and the refresh time.

32. The method according to claim 31, wherein the SRAM access time is shorter than the sum of the refresh time for refreshing the DRAM memory cells and twice the DRAM access time.

33. The method according to claim 31, wherein the SRAM access time is shorter than the sum of twice the refresh time for refreshing the DRAM memory cells and the DRAM access time.

* * * * *